United States Patent
Benmansour (10) Patent No.: US 12,289,875 B2
(45) Date of Patent: Apr. 29, 2025

(54) SIGNAL SHIELDING AND SOUND INSULATING GADGETS STORING DEVICE

(71) Applicant: Othman Benmansour, Puteaux (FR)

(72) Inventor: Othman Benmansour, Puteaux (FR)

( * ) Notice: Subject to any disclaimer, the term of this patent is extended or adjusted under 35 U.S.C. 154(b) by 192 days.

(21) Appl. No.: 18/112,947

(22) Filed: Feb. 22, 2023

(65) Prior Publication Data

US 2023/0269918 A1 Aug. 24, 2023

Related U.S. Application Data

(60) Provisional application No. 63/312,871, filed on Feb. 23, 2022.

(51) Int. Cl.
*H05K 9/00* (2006.01)

(52) U.S. Cl.
CPC .......... *H05K 9/002* (2013.01); *H05K 9/0049* (2013.01)

(58) Field of Classification Search
CPC .... H05K 9/0007; H05K 9/002; H05K 9/0049; H04B 1/3888; H04K 2203/12; H04K 2203/16; H04K 2203/14; H04K 3/825; H04K 2203/18; H04K 3/68
See application file for complete search history.

(56) References Cited

U.S. PATENT DOCUMENTS

| 9,979,427 | B2 * | 5/2018 | Thomas | H04B 1/3888 |
| 10,483,775 | B1 * | 11/2019 | LaBerteaux | G10K 11/1752 |
| 2012/0085576 | A1 | 4/2012 | Malone | |
| 2014/0161273 | A1 | 6/2014 | Soufan et al. | |
| 2016/0234356 | A1 | 8/2016 | Thomas et al. | |

FOREIGN PATENT DOCUMENTS

| CN | 104318918 A | 9/2014 |
| CN | 104219941 A | 12/2014 |
| CN | 205005107 U | 1/2016 |
| CN | 206542696 U | 10/2017 |
| CN | 208401851 U | 1/2019 |
| CN | 209497807 U | 10/2019 |
| CN | 112867375 A | 5/2021 |
| CN | 214014896 U | 8/2021 |

* cited by examiner

*Primary Examiner* — James Wu
(74) *Attorney, Agent, or Firm* — Boris Leschinsky

(57) ABSTRACT

A storage device is configured for electromagnetic shielding and sound insulation to secure gadgets like phones and smartwatches in environments requiring cybersecurity or confidentiality. The device features a housing made from materials that block sound and electromagnetic interference comprising multiple compartments that detect stored gadgets via sensors. It employs passive acoustic insulation and active audio jamming to disrupt microphone functionality and prevent voice recognition. The compartments are adjustable, allowing different sliding or rotational configurations, and are equipped with locking mechanisms. A user interface provides real-time status updates, such as power state, compartment occupancy, and jamming activity. This multi-functional design ensures optimal protection of sensitive information during confidential meetings or in secure IT environments.

15 Claims, 6 Drawing Sheets

SIGNAL SHIELDING AND SOUND INSULATING GADGETS STORING DEVICE

CROSS-REFERENCE DATA

The present application claims a priority date benefit from the U.S. Provisional Patent Application No. 63/312,871 filed on 23 Feb. 2022 with the same title and incorporated herein by reference in its entirety.

FIELD OF INVENTION

The present invention relates to a gadget storing device for maintaining confidentiality and cybersecurity of IT systems and networks at environments that host confidential meetings or sensitive IT systems and networks. More specifically, the present invention relates to an electromagnetic shielding and sound insulating storage device having multiple storing compartments for storing gadgets such as mobile phones, smartwatches etc., providing high performance of sound insulation for confidentiality purpose, electromagnetic shielding and isolating multiple gadgets kept inside from each other and from the environment, and having a light weight, movable and user-friendly form factor.

BACKGROUND

Background description includes information that may be useful in understanding the present invention. It is not an admission that any of the information provided herein is prior art or relevant to the presently claimed invention, or that any publication specifically or implicitly referenced is prior art.

Today people carry gadgets such as mobile phones, smartwatches etc. continuously and everywhere. Many of these gadgets feature audio and video recording capabilities as well as wireless connectivity technologies. With the continuous development of technology, these gadgets keep being enhanced with more and better sensors, computing and connectivity. While these gadgets bring convenience and utility, they also bring privacy and cybersecurity risks.

Gadgets such as mobile phones, smartwatches, and other hand-held electronic devices can be used to perform unauthorized audio or video recording or photographs capturing. These capabilities represent serious confidentiality threats in environments where confidential information is being shared or exhibited. Furthermore, these gadgets can be subject to attacks with malicious programs (spyware) that enable an attacker to remotely trigger and exfiltrate audio or video recordings. Using connected gadgets as spy tools is an increasing practice that will continue to increase as these gadgets are becoming ubiquitous and as their software-driven nature makes them subject to exploitable vulnerabilities.

Besides, gadgets such as mobile phones, smartwatches etc, may contain embedded computing and wireless connectivity technologies that can be used to carry out sophisticated spying attacks or cyberattacks on nearby Information Technology systems and networks. They can be used to intercept and interpret electromagnetic or audio signals from targeted devices. They can also perform data communications or sabotage actions with targeted devices. It is worth noting that gadgets such as mobile phones, smartwatches, etc. are themselves among the electronic devices that can be targeted by the here-described types of attacks.

These gadgets' form factor and the widespread acceptability toward their presence, make them a relevant tool for covertly performing such attacks in multiple situations.

Therefore, it is a necessity to effectively block the acoustic, optical, and electromagnetic signals from the gadgets or to the gadgets in specific environments that host confidential meetings or sensitive Information Technology systems and networks. At present, proposed gadgets insulating boxes rely on sound-insulating material with which passive acoustic isolation and absorption is performed. The limit of this technique is that, firstly, it requires an important weight and space volume of insulating material around each gadget. Secondly, it can hardly reach the required insulating performance that prevents any exploitable recording (such as by using signal enhancement techniques) while being in close proximity to the sound source and while having a user-friendly and real-life-compatible form factor.

Also, the currently proposed insulating boxes rely on electromagnetic shielding to block radio signals from the gadgets or to the gadgets. However, when the insulating box is designed to host more than one gadget, the individual gadgets are not electromagnetically isolated from each other.

In short, there is no comprehensive solution for maintaining the confidentiality and Information Technology systems and networks cybersecurity from spying and cyber-espionage risks coming from gadgets such as mobile phones, smartwatches etc., in sensitive environments, that is neutralizing multiple gadgets at the same time, totally preventing audio recordings even at close proximity to the sound source, storing securely the gadgets, and having a light-weight and practical form factor at the same time. Hence, in the light of the foregoing, there is a need for an electromagnetic shielding and sound-insulating gadgets storing device that overcomes problems present in the prior art.

SUMMARY

The present invention relates to an electromagnetic shielding and sound-insulating storage device having multiple storage compartments for storing gadgets such as mobile phones, smartwatches etc. in order to protect confidentiality in places where sensitive meetings are held from secret recordings (both through a spyware-compromised gadget or through unauthorized recordings by the gadget's owner) as well as protecting adjacent sensitive Information Technology systems from wireless cyberattacks using these gadgets as vectors. The device includes a housing, a lid, a plurality of compartments, locking mechanisms for the compartments and for the housing, electroacoustic transducers, a controller, and an LED interface. Further, the device includes a handle for carrying the device easily.

The objective of the present invention is to overcome the disadvantages of the prior art.

It is another object of the present invention to provide electromagnetic shielding and sound insulating gadget storing device, wherein the device comprises a plurality of compartments for storing gadgets.

It is another object of the present invention to provide electromagnetic shielding and sound insulating gadget storing device, wherein the device comprises a lock that secures the lid as well as locks that secure each of the compartments.

It is another object of the present invention to provide effective sound insulation that prevents stored gadgets from recording any exploitable or recoverable conversation even at close proximity to the sound source by relying on both a passive materials-based acoustic isolation and absorption as well as an active audio jamming based on broadcasting sound inside the device that has microphone-saturating and intelligibility-breaking characteristics.

It is another object of the present invention to provide an electromagnetic isolation that prevents stored gadgets from communicating between each other through any electromagnetic wireless connectivity to protect each stored gadget from undergoing potential wireless attacks from another stored gadget.

It is an object of the present invention to provide electromagnetic shielding and sound insulating gadgets storing device, wherein the device is light weight, compact, and easy to carry.

It is another object of the present invention to provide electromagnetic shielding and sound-insulating gadgets storing device, wherein the device is user-friendly and easy to operate.

These and other objects and advantages of the present invention will become more apparent as the description proceeds, reference being made to the following detailed description and the appended claims along with the accompanying drawings in which like numerals represent like components.

BRIEF DESCRIPTION OF DRAWINGS

The accompanying drawings are included to provide a further understanding of the present disclosure and are incorporated in and constitute a part of this specification. The drawings illustrate exemplary embodiments of the present disclosure and, together with the description, serve to explain the principles of the present disclosure. In the figures, similar components and/or features may have the same reference label. Further, various components of the same type may be distinguished by following the reference label with a second label that distinguishes among the similar components. If only the first reference label is used in the specification, the description is applicable to any of the similar components having the same reference label irrespective of the second reference label.

DETAILED DESCRIPTION

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise. If the specification states a component or feature "may", "can", "could", or "might" be included or have a characteristic, that particular component or feature is not required to be included or have the characteristic.

Exemplary embodiments will now be described more fully hereinafter with reference to the accompanying drawings, in which exemplary embodiments are shown. This disclosure may, however, be embodied in many different forms and should not be construed as limited to the embodiments set forth herein. These embodiments are provided so that this disclosure will be thorough and complete and will fully convey the scope of the disclosure to those of ordinary skill in the art. Moreover, all statements herein reciting embodiments of the disclosure, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

The present invention relates to an electromagnetic shielding and sound-insulating storage device having multiple storage compartments for storing gadgets such as mobile phones, smartwatches etc., for protecting confidentiality in places where sensitive meetings are held from secret recordings (both through a spyware-compromised gadget or through unauthorized recordings by the gadget's owner) as well as protecting adjacent sensitive IT (Information Technology) systems and networks from wireless cyber-attacks and cyber-espionage using these gadgets as vectors. The term "gadget" is used herein to describe any known hand-held electronic devices that have the capability to record or broadcast any optical, acoustic, or electromagnetic signal. Typical examples of these gadgets include a smartphone, a smartwatch, a fitness tracker, wireless headphones, wireless earbuds, a sound recorder, a hand-held GPS recorder, a hand-held scanner, as well as somewhat larger devices like a tablet, a laptop computer, a digital camera, an e-reader, a game controller, etc., as the invention is not limited in this regard.

The device is lightweight and easy to carry. The device is having a plurality of compartments acoustically and electromagnetically isolated from an environment. The device generates an audio jamming signal that prevents stored gadgets kept there-inside from recording any exploitable conversation happening outside of the device. The device electromagnetically isolates gadgets kept inside, preventing them from having any malicious radio communication between them or between them and the outside world. The device is provided with locking and unlocking systems for ensuring the safety of gadgets kept inside. The device is user-friendly and easy to operate.

From herein afterward, the device is referred to as the device 100.

Referring now to the FIG. 1 through FIG. 5, the device 100 includes a housing 101, a lid 102, a plurality of removable compartments 103, a plurality of sensors 110, optionally an operating knob or button 112, a plurality of electroacoustic transducers 113, and a controller 111. Further, the device includes a handle 106 for carrying the device 100 from one location to another location.

Figure 1:
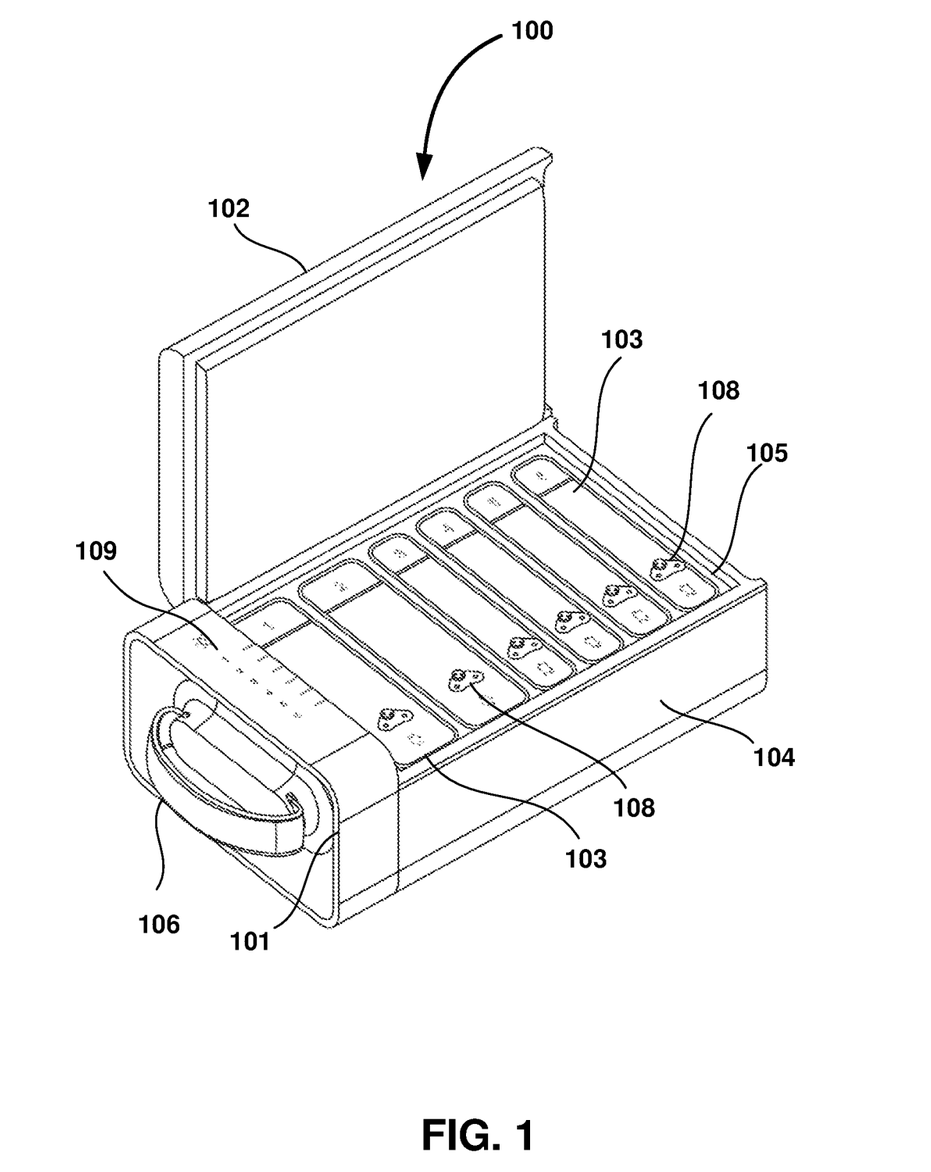
FIG. 1 illustrates a perspective view of an opened signal shielding and sound insulating gadgets storing device, according to an embodiment of the present invention.
Figure 2:
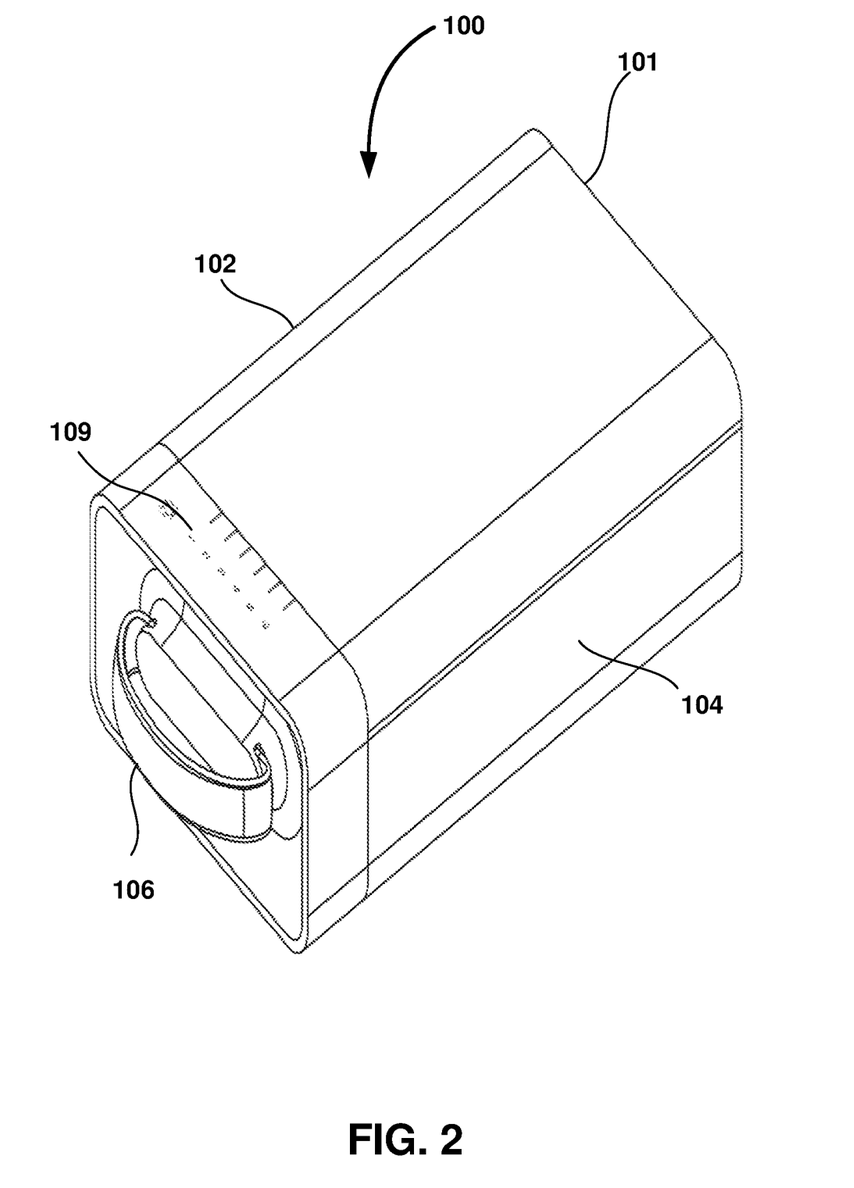
FIG. 2 illustrates a perspective view of a closed signal shielding and sound insulating gadgets storing device, according to an embodiment of the present invention.

The housing 101 is preferably a rectangular box but not limited to this specific shape and having a base portion 104 and a top opening. The housing 101 is hollow inside forming an internal chamber 105. The lid 102 is hinged to the housing 101 using hinges (not shown in the drawings) to permit an opening and a closing of the top opening of the internal chamber 105. FIG. 2 shows the chamber 105 closed using the lid 102. The housing 101, the lid 102 and the compartments 103 are made of opaque, acoustically and electromagnetically isolating, and absorbing materials as described below in greater detail.

In some embodiments, the lid 102 includes a lid latching member (not shown in the drawings). The lid latching member fixes the lid 102 to the base portion 104 when chamber 105 is in the closed position to obtain a volume of space acoustically and electromagnetically isolated from an environment surrounding chamber 105.

In general, the housing 101, the lid 102, and the removable compartments 103 are made from or coated with layers of different materials. In an exemplary non-limiting implementation, an outer layer of the housing 101 and the lid 102 is made of a conductive and dense metallic outer layer for optical and acoustic isolation and electromagnetic shielding. The electromagnetic isolation is achieved through the implementation of a Faraday cage. The combination of a conductive metal housing and compartments coated with multiple layers of a metalized fabric that has high attenuation property on the targeted frequency range (between 600 mHz and 40 Ghz) may be used in some embodiments of the invention. Compartment closure may be designed in a way that provides for the electrical contact between the electromagnetic shielding layers of the compartment 103 and the other adjacent components, so that closing the lid 102 forms a continuous electromagnetic shielding cage.

One or multiple inner layers are made of acoustic absorption materials such as foams, for example, open-cell polyurethane foams. The sound-reducing materials are selected to at least partially absorb and/or partially reflect the sound waves. The compartments 103 are made of multiple layers of electromagnetic isolation materials (e.g., metallic sheets, polymer meshes, and fleeces). The housing may be made from more than one internal layer of metal alternating with layers of foam to acoustically isolate the internal chamber as much as possible. At least one layer of the housing may have integrated 3D shapes designed to reflect and further attenuate sounds inside the internal chamber. This is generally referred to as acoustic metamaterials. The housing may also include external sound-absorbing pads to stand on.

The electromagnetic isolation and shielding materials are selected to be of suitable thickness to sufficiently attenuate radio frequency signals from and to the one or more gadget(s) 115 kept inside the compartments 103 to a level below exploitability levels for known radio frequency communications protocols used by these gadgets 115 (e.g., WIFI, LTE, Bluetooth, NFC). In case a metallized fabric is used, the gap size of each open cell may be selected to be sufficiently small so as to be below the wavelength of the targeted radio frequencies sought to be suppressed. This is done to prevent these gadgets from emanating or receiving signals that are strong enough to be of use for these communication protocols. In general, signals lower than $-90$ dBm (decibels relative to a milliwatt) are considered unusable for wireless communications. In embodiments, reduction of the electromagnetic signal may be set to be below $-90$ dBm, $-95$ dBm, $-100$ dBm, $-110$ dBm, or even lower as the invention is not limited in this regard.

The one or more compartments 103 are configured for receiving the gadget inside thereof. The internal size of each compartment may be selected to be sufficient to receive a smartphone inside thereof. In other embodiments, more than one compartment 103 may have the same or different sizes so as to store one or more gadgets inside thereof. In one exemplary embodiment, each compartment is configured to rotate inside the chamber 105, exposing an opening 107 therein sized to accept the gadget inside the compartment 103. One, several, or each compartment 103 may receive one or more gadgets 115 therein through a compartment opening 107. Each compartment 103 is hinged to the housing 101 inside the chamber 105. The compartments 103 may be provided with locking arms. The locking arm may be a biasing member having a predefined elasticity. The interior of the chamber 105 is provided with a plurality of locking slots. The locking slot holds the received locking arm therein when the compartment 103 is inside the chamber 105. The compartments 103 are each provided with a compartment handle 108.

Figure 3:
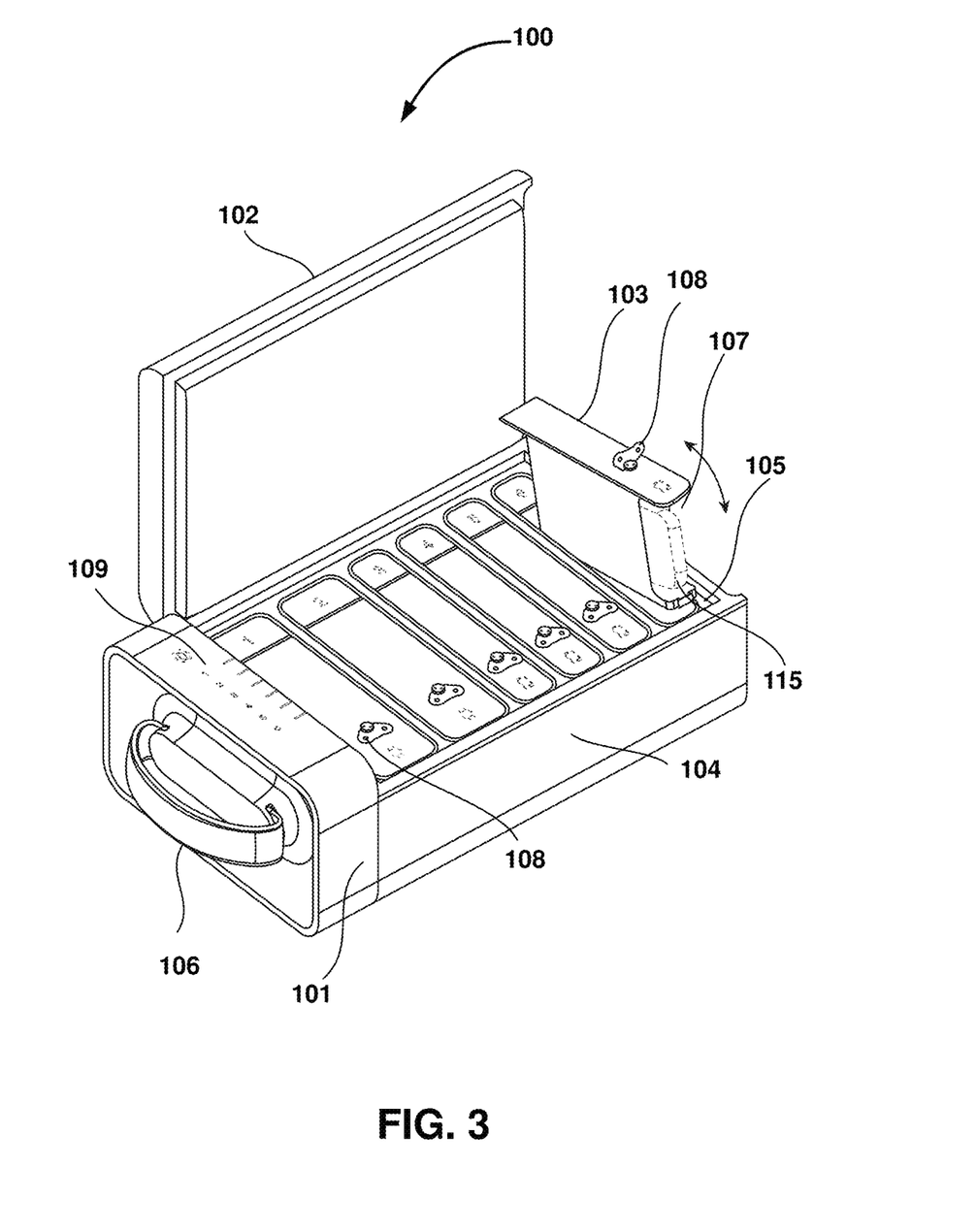
FIG. 3 illustrates a view of FIG. 1 with one compartment rotated outside the chamber.

When a force is applied to the compartment handle 108 by a user to swing the compartment 103 outside the chamber 105, the locking slot starts to release the locking arm held therein. Once the locking arm is released by the locking slot, the compartment opening 107 is accessible to the user, as seen in FIG. 3. When force is applied to the compartment handle 108 by the user to rotate the compartment 103 inside the chamber 105, the locking slot starts to receive the locking arm therein. Once the locking arm is received by the locking slot, the compartment opening 107 is no longer accessible to the user.

Figure 4:
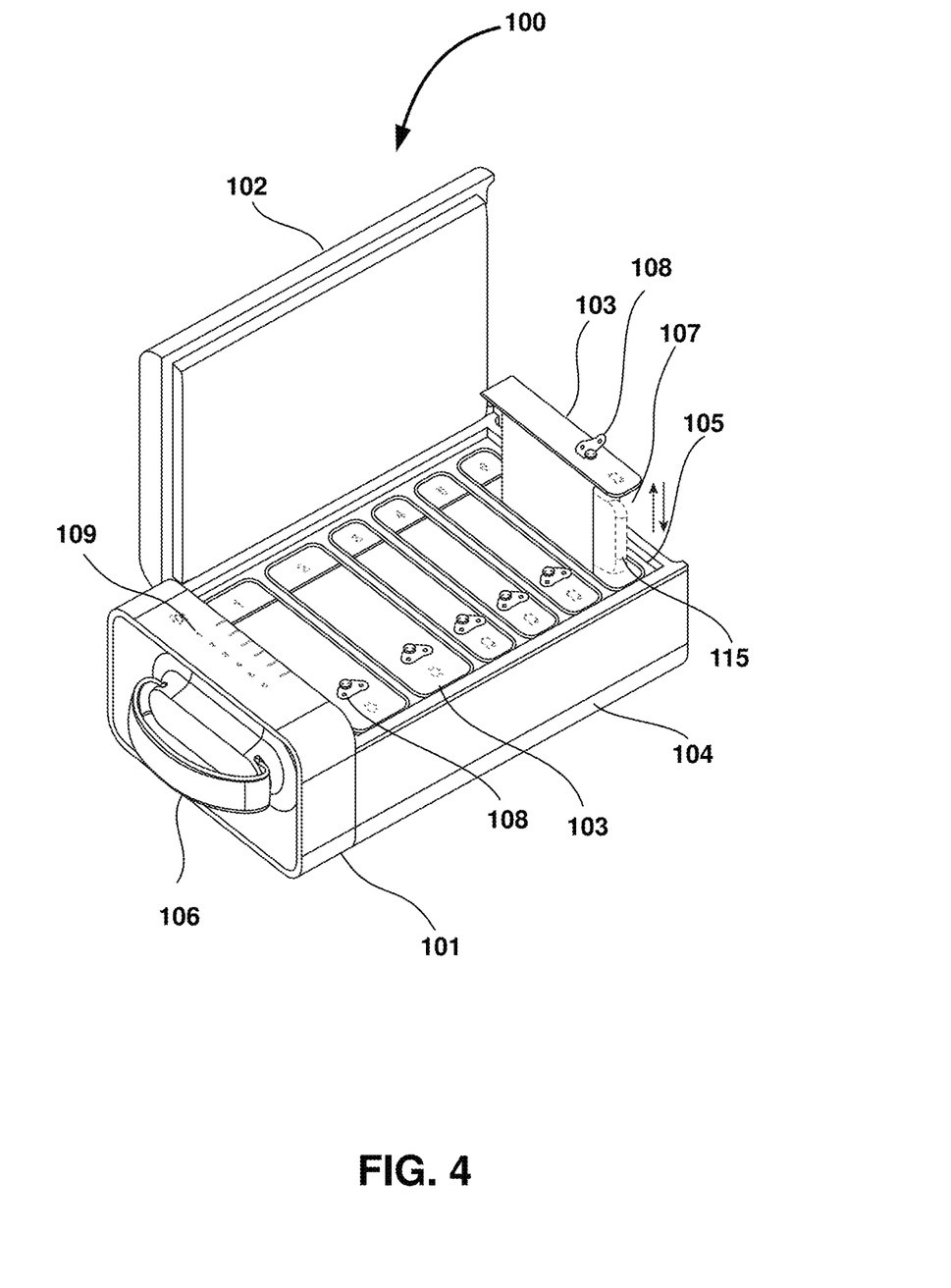
FIG. 4 illustrates a view of FIG. 1 with one compartment pulled outside the chamber.
Figure 5:
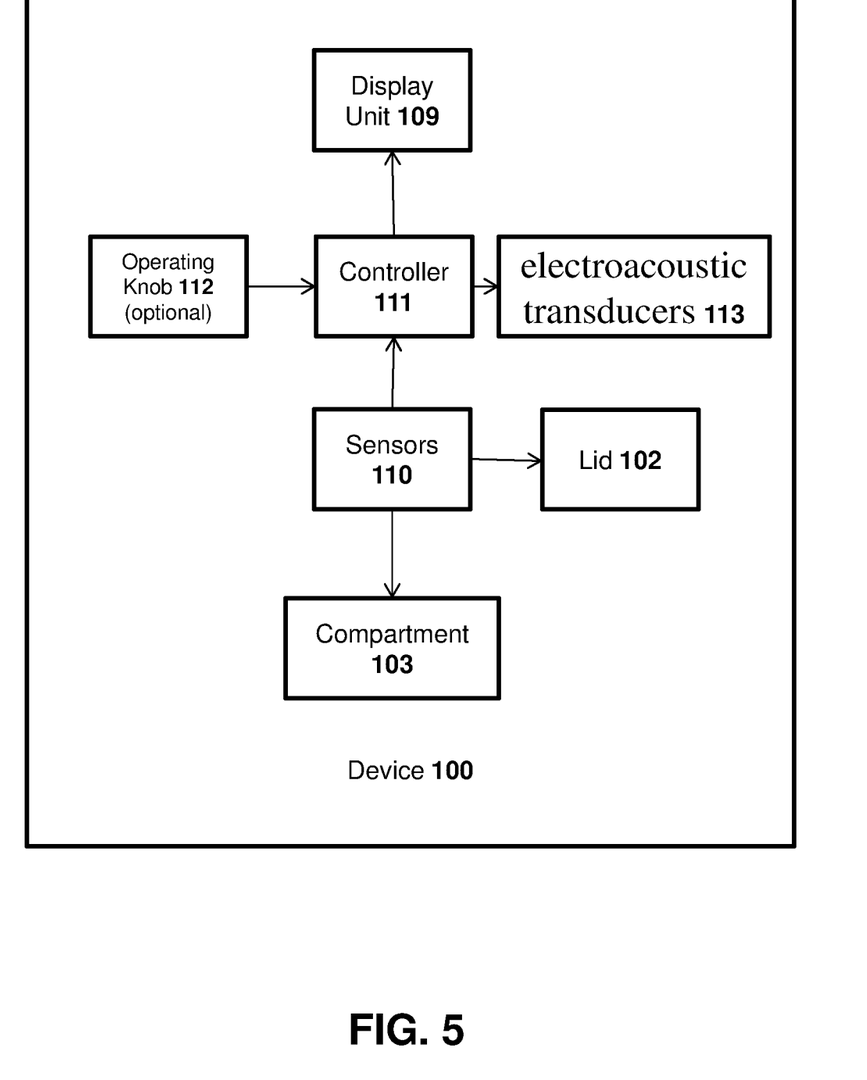
FIG. 5 shows a block diagram of FIG. 1.

In further embodiments of the present invention, the compartments 103 are slidably retained inside the chamber 105. The interior of the chamber 105 is provided with a plurality of vertically oriented rails (not shown in the drawings). The rails are configured as extensions from the interior surface of the chamber 105. The compartments 103 are slidably retained by the rails. When a pulling force is applied to the compartment handle 108 by the user to slide out the compartment 103 from the chamber 105, the compartment 103 slides towards the top opening of the housing 101. Once the compartment 103 is pulled outside the chamber 105, the compartment opening 107 is accessible to the user, as seen in FIG. 4 Therefore, the user is allowed to keep the gadgets inside the compartment 103 or to retrieve the gadgets 115 kept inside the compartment 103. When a closing force is applied to the compartment handle 108 by the user to push the compartment 103 inside the chamber 105, the compartment 103 slides towards the interior of the chamber 105. Once the compartment 103 is pushed inside the chamber 105, the compartment opening 107 is no longer accessible to the user.

A power source provides a power to the device 100. The power source is a battery or a rechargeable battery. In one more embodiment, the power is provided to the device 100 using an external power source through a port. The device 100 is provided with a switch to turn power ON or OFF.

In the preferred embodiment, the plurality of sensors 110 is configured for sensing the presence of gadgets 115 received inside the one or more compartments 103 and to detect the position of the lid 102. The sensors 110 may include one or more of a proximity sensor, a displacement sensor, a lid position sensor, an infra-red (IR) sensor, and a weight sensor. In a given example, the position sensor senses the position of the lid 102. The displacement sensor is configured to sense the displacement of the lid 102. It is known to a person ordinary skilled in the art to configure known sensors 110 with or within the housing 101 or within the compartments 103. The sensors 110 send the sensed data to the controller 111 for displaying information about the compartments 103 and the device 100 status (e.g. device 100 powered on, total number of gadgets 115 received inside the device 100 etc.) using a display unit 109. The display unit 109 may include a color-coded light or a display screen.

The controller 111 comprises one or more controllers, processors, microcontrollers, microcomputers, or microprocessors—with suitable memory and other required components. The controller 111 is connected to the sensors 110, the display unit 109, an optional operating knob or button 112, and the one or more electroacoustic transducers 113, as seen in the block diagram of FIG. 5. The sensors 110 send the detected positions of the lid 102 (closed or open) to the controller 111 for respectively activating or deactivating the electroacoustic transducers 113. The controller 111 activates the electroacoustic transducers 113 upon receiving the signal from the sensor 110, when the lid 113 is at the closed position. Similarly, the controller 111 deactivates the electroacoustic transducers 113 upon receiving the signal from the sensor 110, when the lid 113 is at open position. In another alternative embodiment, the controller 111 receives a command for activating or deactivating the electroacoustic transducers 113 from the user using the operating knob or button 112. The electroacoustic transducers 113 are installed inside the chamber 105. The electroacoustic transducers 113 play sounds generated by the controller 111. The audio signals played by the electroacoustic transducers 113 have a saturating effect on the microphones of the gadgets 115 kept inside the compartments 103 and an intelligibility-breaking effect on human voice potentially recorded by the aforementioned microphones. Therefore, the gadgets 115 kept inside the compartments 103 are prohibited from any exploitable recording of human conversations coming from the environment, even after applying audio enhancement techniques. The materials-based acoustic isolation and the sound level of the audio signal broadcasted inside the chamber 105 allow achieving the sound insulation goal of the gadgets 115 kept inside the device 100 without leaking any sound outside the device 100 that could annoy humans present in the environment of the device 100.

In an exemplary illustrative non-limiting implementation, the audio signals broadcasted though the electroacoustic transducers 113 include sounds at frequencies corresponding to human voice frequencies essential to conversations' intelligibility (notably consonants linked frequencies). In embodiments, the frequency of the audio signal inside the chamber 105 is above 500 Hz. In other embodiments, this frequency is in a range from about 2 kHz to about 4 kHz. In further examples, the frequency and the sound signal itself may be variable or random so as to reduce the risk of sound recording manipulation and postprocessing afterward. The audio signals broadcasted through the electroacoustic transducers 113 have, this way, a jamming effect on the potentially recorded conversations by the stored gadgets, in addition to the saturation effect on these gadget's microphones. In embodiments, these audio signals may comprise one or more mixed recordings of a human speech selected from an onboard computer-controlled library of human voices. In further embodiments, the speech may be synthesized by the device of the present invention. In further yet embodiments, the speech portions may be in different languages, or an overlap of male, female, and/or children voices. In further yet embodiments, more than one electroacoustic transducer may be positioned in various locations throughout the internal chamber and may be activated at the same time or randomly at different times throughout the storage interval. Therefore, the gadgets 115 kept inside the compartments 103 are prohibited from a clean recording of the conversations (or other sound types if this implementation is adapted to these other sound types characteristics) coming from the environment.

In an embodiment of the present invention, each compartment 103 is provided with a locking system for locking and unlocking thereof. The locking system may include a mechanical lock, an electromechanical lock, or both. In one more alternative embodiment, the locking system is incorporated with a biometric locking unlocking facility.

Figure 6:
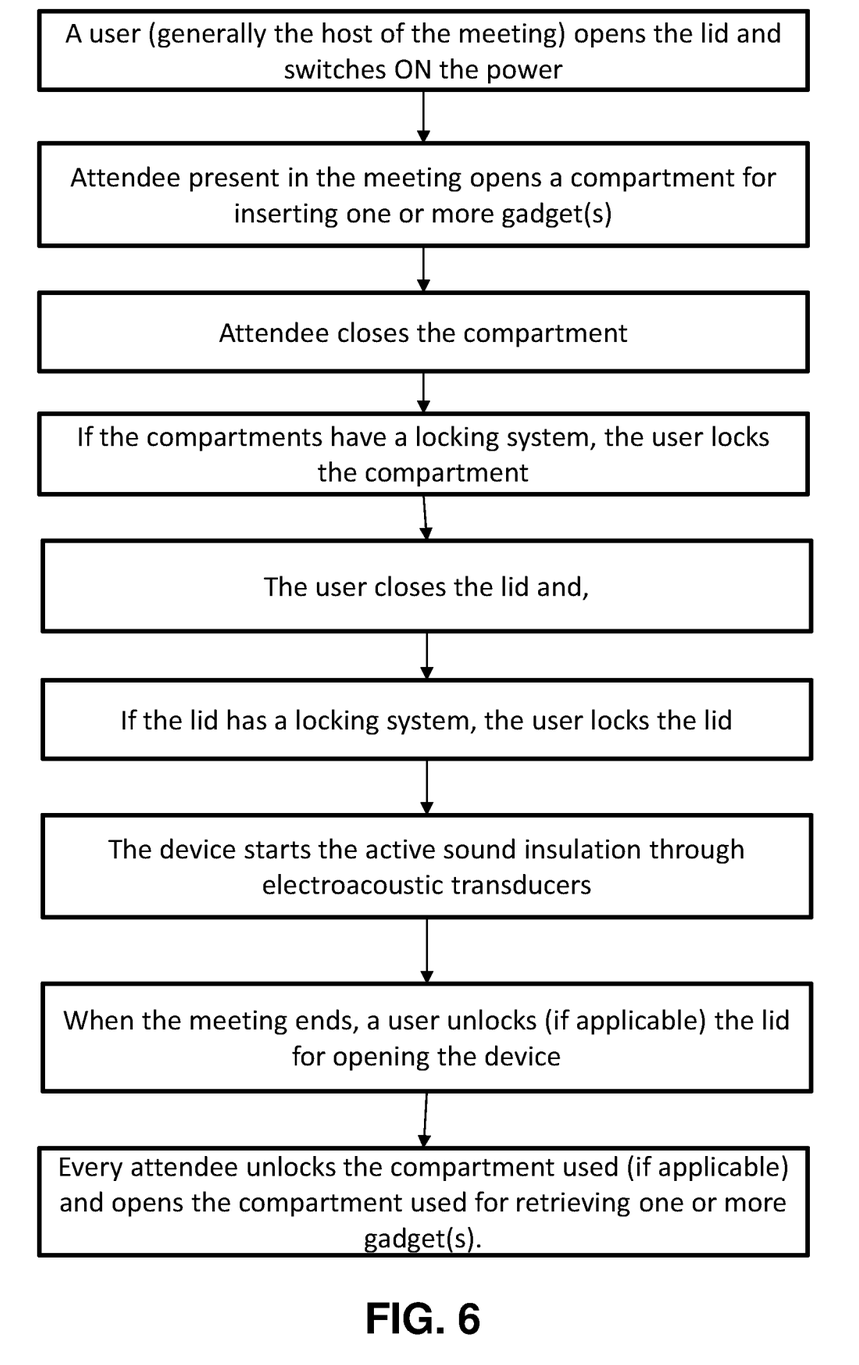
FIG. 6 shows a flow chart for operating the device of FIG. 1.

In a given example as shown in FIG. 6, the user attending the confidential meeting is requested to keep the smart gadgets 115 inside the device 100. For that, the user needs to pull or rotate the compartment 103 outside the chamber 105 after opening the lid 102 for keeping the gadgets 115 therein. When the gadgets 115 of all attendees are kept inside the chamber 105, the lid 102 is closed and optionally locked using the latching member. After switching ON the power switch and giving the command to the controller 111 using the operating knob or button 112 or auto closure of the lid 102, the electroacoustic transducers 113 play the jamming audio signals. Therefore, the gadgets 115 kept inside the compartments 103 are prohibited from all kinds of recordings. The attendees can start the secret meeting. Furthermore, the gadgets 115 kept inside are isolated optically, acoustically, and electromagnetically and thus prohibited from having any wireless communication between them or with the environment of the device 100.

The present invention offers an advantage of providing an electromagnetic shielding and sound insulating storage device 100 having multiple storage compartments 103 for storing gadgets 115 such as mobile phones, smartwatches etc. for maintaining the confidentiality and IT systems cybersecurity at environments that host confidential meetings or sensitive Information Technology systems and networks. The device 100 is lightweight and easy to carry. The device 100 is having a plurality of compartments 103 acoustically and electromagnetically isolated from an environment. As a complement to the materials-based acoustic isolation, the device 100 generates audio signals in the chamber 105 to achieve microphone saturation and human voice intelligibility-breaking characteristics, so as to prevent gadgets 115 kept inside from recording any conversation happening in the environment of the device 100. The device 100 electromagnetically isolates any gadget 115 kept inside from any other gadget 115 also kept inside to prevent any radio frequency based cyber-attack or cyber-espionage attack from happening between gadgets 115 kept inside. The device 100 also electromagnetically isolates gadgets 115 kept inside from the environment of the device 100 for preventing any radio frequency based cyber-attack or cyber-espionage attack from happening against any sensitive Information Technology system or network present in the environment of the device 100. The device 100 is user friendly and easy to operate.

Additional useful features may be added to the device of the present invention. In embodiments, hand-held electronic devices may be charged using cables or wireless coils incorporated with the compartments 103 of the device. This feature may be especially useful when the device 100 is used at home so as to prevent unauthorized listening to the voice of the user and charge the gadget at the same time. At least one charging cable or at least one wireless charging coil may be located inside the internal chamber for a convenient attachment to the gadget stored therein. In further embodiments, a retractable charging cable may be present in every compartment 103.

Gadget sanitizing is another useful feature that may be added to the device 100 of the present invention. One or more UV lights, such as UVC LEDs emanating ultraviolet light in the bactericidal C range of UV frequencies, may be added in one or more locations throughout the internal chamber and can be automatically activated by the controller along with the electroacoustic transducer of the invention.

It should be understood according to the preceding description of the present invention that the same is susceptible to changes, modifications and adaptations, and that the said changes, modifications and adaptations fall within scope of the present invention.

What is claimed is:

1. A signal-shielding and sound-insulating device for storing one or more hand-held electronic devices inside thereof, the sound-shielding and sound-insulating device comprises:
    a housing with an internal chamber sized to accept the one or more hand-held electronic devices inside thereof, the housing further comprising a lid configured to allow for placement and removal of the one or more hand-held electronic devices into and out of the internal chamber, the housing and the lid are made from an electromagnetically-shielding material layer and at least one acoustically isolating and/or acoustically absorbing material layer configured to acoustically isolate the internal chamber,
    one or more compartments sized and configured to be positioned inside the internal chamber of the housing and having an opening to accept the one or more hand-held electronic devices inside thereof,
    at least one sensor configured to indicate whether the one or more hand-held electronic device is placed inside the housing,
    at least one electroacoustic transducer configured to broadcast sound inside the housing, and
    a controller configured to activate the at least one electroacoustic transducer upon detecting the presence of the one or more hand-held electronic device.

2. The signal-shielding and sound-insulating device as in claim 1, further comprising the at least one sensor configured to detect an open or a closed position of the lid, wherein the controller is further configured to activate the one or more electroacoustic transducer upon detecting the presence of the one or more hand-held electronic device device and the closed position of the lid.

3. The signal-shielding and sound-insulating device as in claim 1,
    wherein the housing and the lid are made from metal as an outer layer and a sound-absorbing foam as an inner layer thereof.

4. The signal-shielding and sound-insulating device as in claim 3, wherein the housing and the lid are made from a metal of sufficient thickness to reduce any electromagnetic signals from the internal chamber to a level at or below −90 dBm.

5. The signal-shielding and sound-insulating device as in claim 1, wherein the electroacoustic transducer is configured to generate sound at frequencies corresponding to frequencies of a human voice.

6. The signal-shielding and sound-insulating device as in claim 5, wherein the electroacoustic transducer is configured to generate sound at frequencies of at least 500 Hz.

7. The signal-shielding and sound-insulating device as in claim 1, wherein the electroacoustic transducer is configured to generate sound at frequencies at 2 kHz to 4 kHz.

8. The signal-shielding and sound-insulating device as in claim 7, wherein the electroacoustic transducer is configured to generate sound randomly at frequencies between 2 kHz and 4 kHz.

9. The signal-shielding and sound-insulating device as in claim 1, wherein the one or more compartments are configured to rotate while inside the housing to allow for placement and removal of the one or more hand-held electronic device into and out thereof.

10. The signal-shielding and sound-insulating device as in claim 1, wherein the one or more compartments are configured to slide in and out of the housing to allow for placement and removal of the one or more hand-held electronic device into and out thereof.

11. The signal-shielding and sound-insulating device as in claim 1, wherein the one or more compartments are made from electromagnetically shielding material to prevent electromagnetic communication emanating from or reaching the one or more hand-held electronic devices when placed inside the respective compartments.

12. The signal-shielding and sound-insulating device as in claim 11, wherein the compartments are made from metal.

13. The signal-shielding and sound-insulating device as in claim 1, wherein the housing and the lid are made from an opaque material.

14. The signal-shielding and sound-insulating device as in claim 1, wherein the housing and the lid comprise at least a layer of acoustic metamaterial.

15. The signal-shielding and sound-insulating device as in claim 1 further comprising at least one charging cable or at least one wireless charging coil configured to charge the one or more hand-held electronic device stored therein.

* * * * *